United States Patent
Kalich et al.

(10) Patent No.: US 9,630,379 B2
(45) Date of Patent: Apr. 25, 2017

(54) LAMINATED COMPOSITE MADE UP OF AN ELECTRONIC SUBSTRATE AND A LAYER ARRANGEMENT COMPRISING A REACTION SOLDER

(71) Applicant: Robert Bosch GmbH, Stuttgart (DE)

(72) Inventors: Thomas Kalich, Victoria (AU); Christiane Frueh, Ludwigsburg (DE); Franz Wetzl, Mundelsheim (DE); Bernd Hohenberger, Wendlingen (DE); Rainer Holz, Marbach (DE); Andreas Fix, Stuttgart (DE); Michael Guyenot, Ludwigsburg (DE); Andrea Feiock, Pliezhausen (DE); Michael Guenther, Stuttgart (DE); Martin Rittner, Freiberg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/348,747

(22) PCT Filed: Sep. 21, 2012

(86) PCT No.: PCT/EP2012/068678
§ 371 (c)(1),
(2) Date: Mar. 31, 2014

(87) PCT Pub. No.: WO2013/045370
PCT Pub. Date: Apr. 4, 2013

(65) Prior Publication Data
US 2014/0248505 A1    Sep. 4, 2014

(30) Foreign Application Priority Data
Sep. 30, 2011    (DE) .................. 10 2011 083 931

(51) Int. Cl.
*B22F 7/00* (2006.01)
*B32B 15/01* (2006.01)
(Continued)

(52) U.S. Cl.
CPC ............ *B32B 15/01* (2013.01); *B23K 1/0006* (2013.01); *B23K 1/0016* (2013.01); *B23K 1/19* (2013.01);
(Continued)

(58) Field of Classification Search
None
See application file for complete search history.

(56) References Cited

U.S. PATENT DOCUMENTS 5,229,070 A    7/1993    Melton et al.
5,427,865 A *  6/1995    Mullen et al. ............... 428/559
(Continued)

FOREIGN PATENT DOCUMENTS

DE    19728014    1/1999
DE    10319888    11/2004
(Continued)

OTHER PUBLICATIONS

Albert et al., "Laser Soldering and Laser Droplet Joining for Mechanical and Electrical Contacting of LTCC/PZT Laminates", Mar. 2011, Journal of Laser Micro/Nanoengineering, vol. 6, pp. 75-80.*

(Continued)

*Primary Examiner* — Humera Sheikh
*Assistant Examiner* — Seth Dumbris
(74) *Attorney, Agent, or Firm* — Michael Best & Friedrich LLP

(57) ABSTRACT

Laminated composite (10) comprising at least one electronic substrate (11) and an arrangement of layers (20, 30) made up
(Continued)

of at least a first layer (20) of a first metal and/or a first metal alloy and of a second layer (30) of a second metal and/or a second metal alloy adjacent to this first layer (20), wherein the melting temperatures of the first and second layers are different, and wherein, after a thermal treatment of the arrangement of layers (20, 30), a region with at least one intermetallic phase (40) is formed between the first layer and the second layer, wherein the first layer (20) or the second layer (30) is formed by a reaction solder which consists of a mixture of a basic solder with an AgX, CuX or NiX alloy, wherein the component X of the AgX, CuX or NiX alloy is selected from the group consisting of B, Mg, Al, Si, Ca, Se, Ti, V, Cr, Mn, Fe, Co, Ni, Cu, Zn, Ga, Ge, Y, Zr, Nb, Mo, Ag, In, Sn, Sb, Ba, Hf, Ta, W, Au, Bi, La, Ce, Pr, Nd, Gd, Dy, Sm, Er, Tb, Eu, Ho, Tm, Yb and Lu and wherein the melting temperature of the AgX, CuX or NiX alloy is greater than the melting temperature of the basic solder. The invention also relates to a method for forming a laminated composite (10) and to a circuit arrangement containing a laminated composite (10) according to the invention.

14 Claims, 1 Drawing Sheet

(51) Int. Cl.
  *B23K 1/00* (2006.01)
  *B23K 35/30* (2006.01)
  *B23K 35/02* (2006.01)
  *H01L 23/00* (2006.01)
  *B23K 1/19* (2006.01)
  *B23K 101/42* (2006.01)

(52) U.S. Cl.
  CPC .......... *B23K 35/0238* (2013.01); *B23K 35/30* (2013.01); *H01L 24/29* (2013.01); *H01L 24/32* (2013.01); *H01L 24/83* (2013.01); *B23K 2201/42* (2013.01); *H01L 2224/2908* (2013.01); *H01L 2224/29109* (2013.01); *H01L 2224/29111* (2013.01); *H01L 2224/29113* (2013.01); *H01L 2224/29118* (2013.01); *H01L 2224/29139* (2013.01); *H01L 2224/29147* (2013.01); *H01L 2224/29155* (2013.01); *H01L 2224/29209* (2013.01); *H01L 2224/29211* (2013.01); *H01L 2224/29213* (2013.01); *H01L 2224/29218* (2013.01); *H01L 2224/29239* (2013.01); *H01L 2224/29247* (2013.01); *H01L 2224/29339* (2013.01); *H01L 2224/29347* (2013.01); *H01L 2224/29355* (2013.01); *H01L 2224/8382* (2013.01); *H01L 2224/83191* (2013.01); *H01L 2224/83192* (2013.01); *H01L 2924/01327* (2013.01); *H01L 2924/12042* (2013.01); *H01L 2924/15747* (2013.01); *H01L 2924/15787* (2013.01); *Y10T 428/12063* (2015.01); *Y10T 428/12222* (2015.01)

(56) References Cited

U.S. PATENT DOCUMENTS

| | | | |
|---|---|---|---|
| 6,569,262 B1 * | 5/2003 | Shohji | 148/24 |
| 2005/0029666 A1 | 2/2005 | Kurihara et al. | |
| 2005/0048758 A1 * | 3/2005 | Hosseini et al. | 438/614 |
| 2006/0186550 A1 | 8/2006 | Ikeda et al. | |
| 2009/0134501 A1 * | 5/2009 | Ganitzer et al. | 257/666 |
| 2009/0139608 A1 * | 6/2009 | Tanaka | B22F 1/0059 148/24 |
| 2009/0243089 A1 * | 10/2009 | Hohlfeld et al. | 257/734 |
| 2011/0220704 A1 * | 9/2011 | Liu et al. | 228/252 |
| 2011/0304985 A1 * | 12/2011 | Rittner et al. | 361/688 |
| 2014/0234649 A1 * | 8/2014 | Kalich et al. | 428/551 |
| 2015/0014865 A1 * | 1/2015 | Frueh et al. | 257/783 |

FOREIGN PATENT DOCUMENTS

| | | |
|---|---|---|
| DE | 60010590 | 5/2005 |
| DE | 102009002065 | 10/2009 |
| DE | 102009034483 | 1/2011 |
| EP | 0834376 | 4/1998 |
| JP | 2003245793 | 9/2003 |
| WO | 03072288 | 9/2003 |
| WO | 2010089647 | 8/2010 |
| WO | 2011112722 | 9/2011 |

OTHER PUBLICATIONS

Definition of Adjoining, 2002, Webster's Third New International Dictionary, Merriam-Webster, p. 27.*
International Search Report for Application No. PCT/EP2012/068678 dated Dec. 5, 2012 (English Translation, 3 pages).

* cited by examiner

LAMINATED COMPOSITE MADE UP OF AN ELECTRONIC SUBSTRATE AND A LAYER ARRANGEMENT COMPRISING A REACTION SOLDER

BACKGROUND OF THE INVENTION

The invention relates to a laminated composite containing a layer arrangement and an electronic substrate and also to a circuit arrangement containing a laminated composite. The invention further relates to a method for forming a laminated composite.

Power electronics are used in many technical fields. The use of power electronics is unavoidable particularly in electrical or electronic devices in which high currents flow. The current intensities which are required in power electronics lead to thermal loading of the electrical or electronic components which are present. Further thermal loading is caused by the use of such electrical or electronic devices at places of operation having a temperature which is significantly above room temperature and which may also change continually. Examples which may be mentioned in this respect are control devices in the automotive sector which are arranged directly in the engine compartment.

In particular, many connections between power semiconductors or integrated circuits (ICs) among one another and also to carrier substrates are even today subject to long-term thermal loading of up to 175 degrees Celsius.

Electrical or electronic components are usually joined—for example to a carrier substrate—by a joining layer. Solder joins are known as a joining layer of this type.

Use is usually made of soft solders based on tin-silver or tin-silver-copper alloys. However, particularly at use temperatures close to the melting temperature, such joining layers display a decrease in electrical and mechanical properties, which can lead to failure of the assembly.

Lead-containing solder joins can be used at higher use temperatures than soft solder joins. However, lead-containing solder joins are greatly restricted in respect of their permissible industrial applications by legal obligations for reasons of environmental protection.

An alternative for use at elevated or high temperatures, in particular above 200 degrees Celsius, is lead-free hard solders. Lead-free hard solders generally have a melting point which is higher than 200° C. However, when hard solder is used for forming a joining layer, only few electrical or electronic components which can withstand the high temperatures during melting of the hard solders come into question as join partners.

One solution is low-temperature joining technology (LTJ), in which silver-containing sintered joins can be produced even at significantly lower temperatures than the melting temperature. Here, a paste containing chemically stabilized silver particles and/or silver compounds is used instead of a solder. Under the sintering conditions, in particular at elevated temperature and applied pressure, the stabilizing constituents are burnt out and/or the silver compounds are decomposed so that the silver particles or liberated silver atoms come into direct contact with one another and with the material of the join partners. A join which is stable at high temperatures can be formed by interdiffusion and/or diffusion even at significantly lower temperatures than the melting temperature. However, when such sintered joins are subjected to temperature changes, thermomechanical stresses and even cracking can occur in semiconductor components or even in the carrier substrate.

DE 10 2009 002 065 A1 describes a solder which comprises a soft solder with a melting point of less than 450° C., in which a number of particles formed from an intermetallic phase or coated with an intermetallic phase are embedded. The solder can areally join a metalized ceramic substrate of a power semiconductor module to a base plate. To produce the solder join between the base plate and the ceramic substrate, the solder is heated to a temperature of at least 330° C.

SUMMARY OF THE INVENTION

The present invention relates to a laminated composite comprising at least one electronic substrate and a layer arrangement made up of at least a first layer of a first metal and/or a first metal alloy and made up of a second layer, adjoining said first layer, of a second metal and/or a second metal alloy, wherein the melting temperatures of the first layer and of the second layer are different, and wherein, after the layer arrangement has been subjected to a thermal treatment, a region with at least one intermetallic phase is formed between the first layer and the second layer.

According to the invention, the first layer or the second layer is formed by a reaction solder which consists of a mixture of a base solder with an AgX, CuX or NiX alloy, wherein the component X in the AgX, CuX or NiX alloy is selected from the group consisting of B, Mg, Al, Si, Ca, Se, Ti, V, Cr, Mn, Fe, Co, Ni, Cu, Zn, Ga, Ge, Y, Zr, Nb, Mo, Ag, In, Sn, Sb, Ba, Hf, Ta, W, Au, Bi, La, Ce, Pr, Nd, Gd, Dy, Sm, Er, Tb, Eu, Ho, Tm, Yb and Lu, and wherein the melting temperature of the AgX, CuX or NiX alloy is higher than the melting temperature of the base solder.

In this respect, the alloy AgX, CuX or NiX should in particular not have the same composition as that of the respective base solder. That is to say, for example, that no CuSn particles can be mixed in in the case of an SnCu base solder.

Advantageously, it is thus possible to provide an electrically conductive and/or heat-conducting connection between electronic components and other components or substrates which, at the same time, can ensure a very good compensation of the different coefficients of thermal expansion of the join partners even over a long period of use. This can be achieved, inter alia, by virtue of the fact that, during a thermal treatment, the reaction solder promotes in particular the formation of large regions of an intermetallic phase, right up to the complete replacement of at least the solder layer by the regions of the intermetallic phase which have been formed.

Within the context of one embodiment, the base solder is selected from the group consisting of SnCu, SnAg, SnAu, SnBi, SnNi, SnZn, SnIn, SnIn, CuNi, CuAg, AgBi, ZnAl, BiIn, InAg, InGa or a ternary, quaternary or a higher-component alloy made up of a mixture thereof Within the context of a further embodiment, the AgX, CuX or NiX alloy is present in a mean particle size of between 1 nm and 50 µm in the mixture with the base solder.

The mean particle size can be understood to mean in particular the size at which 50% by volume of the sample have a smaller particle diameter and 50% by volume of the sample have a larger particle diameter (what is termed the d50 value). The particle size can be determined, for example, by laser scattering and evaluation of the scatter pattern, for example in accordance with the Mie theory, by other optical analysis methods, for example microscopy, or by a sieve analysis method.

Within the context of a further embodiment, the first layer and/or the second layer contains no lead.

The term "no lead" can be understood to mean in particular that the layer in question contains less than 0.05% by weight lead, in particular less than 0.01% by weight and, for example, less than 0.005% by weight.

The invention is therefore suitable as a whole for demonstrating an alternative to lead-containing thermal and electrical connections, for example in microelectronics or in photovoltaics, which to date are still used in particular for special fields of use, for example at high temperatures and/or high current densities.

Within the context of a further embodiment, the Ag, Cu or Ni content of the layer formed by the reaction solder is between 20% by weight and 80% by weight.

Within the context of a further embodiment, the processing temperature of the reaction solder is less than 500° C.

In said embodiment, the subject matter of the present invention is therefore not intended exclusively for replacing a soft solder, but rather can also encompass those reaction solders which count as hard solders according to the classification familiar to a person skilled in the art.

According to a further embodiment, the first layer or second layer which is not formed from the reaction solder forms an intermetallic phase at least partially, preferably completely, with the reaction solder. Particularly in the boundary region between the first layer and the second layer, atomic diffusion processes occur during a thermal treatment and provide for the formation of the intermetallic phase starting from the boundary region in the direction of the first phase and/or second phase.

Within the context of a further embodiment, the first layer or second layer which is not formed from the reaction solder is an Ag sintered layer.

Advantageously, as a joining layer in microelectronics, an Ag sintered layer combines a very good thermal conductivity and outstanding properties in compensating for the different coefficients of thermal expansion of the electronic components and substrates to be joined with good processability.

Within the context of a further embodiment, the region of the intermetallic phase encompasses the first layer or second layer.

This makes it possible to provide a yet further improved property profile of the thermal and electrical connection of an electronic substrate. On account of their high degree of order, intermetallic phases usually exhibit a high thermal and also electrical conductivity. This can advantageously make use in devices with high thermal loading possible. Equally possible is use in devices which have a high current density also with respect to the joining layers. In addition, according to the present invention, the intermetallic phases usually have a low coefficient of thermal expansion, which can be used very advantageously in a joining-layer arrangement to the effect that the adaptation of the greatly differing coefficients of thermal expansion, for example of a semiconductor of a power component and of the material of a heat sink, can also be ensured permanently without the occurrence of fractures or other damaged areas, which can cause failure of the electronic component as a whole.

Within the context of a further embodiment, the intermetallic phase has a higher melting point than the first or second layer.

This advantageously makes it possible to also use the electronic components in devices which are used at a location with high thermal loading, for example control devices for engines or transmissions or sensors and diodes for generators. Here, conventional operating temperatures in the region of 175° C. can prevail, at which temperatures the electronic components can advantageously be used with a laminated composite according to the embodiment. At the same time, however, the processing temperature must not be selected to be so high, so that a lower temperature can be set during the production of the electronic laminated composite, which saves energy, protects resources and is cost-effective.

Within the context of a further embodiment, the region of the intermetallic phase which is formed during the thermal treatment partially or completely replaces the first layer and/or second layer.

This makes it possible to provide a yet further improved property profile of the thermal and electrical connection of an electronic substrate. On account of the high degree of order, intermetallic phases usually exhibit a high thermal and also electrical conductivity. This can advantageously make use in devices with permanently high thermal loading even in regions of 150° C. or higher possible. Made equally possible is use in devices which have a high current density also with respect to the joining layers and therefore provide a correspondingly high current load capacity of the joining layers. In addition, according to the present invention, the intermetallic phases have a low coefficient of thermal expansion, which can be used very advantageously in a joining-layer arrangement to the effect that the adaptation of the greatly differing coefficients of thermal expansion of the electrical or electronic components to be joined, for example of a semiconductor of a power component and of the material of a heat sink, can also be ensured permanently without the occurrence of fractures or other damaged areas, which can cause failure of the electronic component as a whole.

Within the context of a further embodiment, the first layer and/or second layer makes contact with the at least one electronic substrate.

In this way, it is also possible according to the invention to provide a semifinished product in the microelectronics industry, where either the first layer, for example a silver sintered layer, or the second layer, for example the layer formed from the reaction solder, which can also be replaced completely by an intermetallic phase, makes contact with the electronic substrate. This makes it possible both to increase degrees of automation in manufacture and to improve the observance of previously stipulated quality standards and tolerances.

Within the context of a further embodiment, that layer which is formed by the reaction solder is already infiltrated in the other layer, which is preferably formed by an Ag sintered layer, before connection to the at least one substrate.

The term "infiltrated" can be understood to mean in particular that the reaction solder is arranged at least partially in the pores present in the Ag sintered layer, or in comparable interstices in the other layer. An intermetallic phase can be formed at least partially between the layers by the thermal treatment. This process of the formation of an intermetallic phase, in particular by the interdiffusion of the metals or of the alloys of the two layers, can be simplified and completed by the previous infiltration of the reaction solder in the other layer, and therefore a shorter thermal treatment or the formation of larger regions of the intermetallic phase is made possible compared to a simply adjoining arrangement of the layers.

To optimize the infiltration, in particular the average particle size of the AgX, CuX or NiX alloy of the reaction solder is advantageously adapted to the pore size or to the size of the interstices present in the other layer, which is to be infiltrated.

In other words, the layer arrangement of the present invention can also be formed in such a way that the layer comprising the reaction solder is present at least partially, preferably completely, infiltrated in another layer which is porous or has other interstices or chambers.

Within the context of a further embodiment, the at least one electronic substrate is a circuit carrier, in particular a DBC substrate, an LTCC substrate, a leadframe, a printed circuit board or an active component, in particular a power semiconductor or IC, or a carrier substrate or a heat sink.

With respect to further advantages and features, reference is hereby made explicitly to the explanations in conjunction with the laminated composite according to the invention, the product of the method according to the invention, the circuit arrangement according to the invention and also the figures.

The present invention further relates to a method for forming a laminated composite, in particular a laminated composite according to the invention, comprising the following steps:
  forming a raw laminated composite containing a layer arrangement and at least one electronic substrate, wherein the layer arrangement contains at least a first layer of a first metal and/or a first metal alloy and a second layer, adjoining said first layer, of a second metal and/or a second metal alloy, and wherein the melting temperatures of the first layer and of the second layer are different, and wherein the first layer or the second layer is formed by a reaction solder which consists of a mixture of a base solder with an AgX, CuX or NiX alloy, wherein the melting temperature of the AgX, CuX or NiX alloy is higher than the melting temperature of the base solder,
  subjecting the layer arrangement or the raw laminated composite to thermal treatment, as a result of which interdiffusion of the metals and/or metal alloys in the first layer and/or second layer takes place,
  forming the laminated composite containing at least one region of an intermetallic phase between the first layer and the second layer.

Within the context of an embodiment of the method according to the invention, the thermal treatment is carried out at a temperature above the melting temperature of the base solder in the reaction solder.

This preferably ensures that the largest possible region of an intermetallic phase made up of the reaction solder and the other layer is formed, such that the advantages in the property profile of the electrical and thermal connection of the electronic substrate which have already been described above can be optimally achieved.

The present invention further relates to a circuit arrangement containing a laminated composite according to the invention described above, in particular for electronic circuit arrangements for automotive series production and the photovoltaic industry.

BRIEF DESCRIPTION OF THE DRAWINGS

Further advantages and advantageous configurations of the subjects according to the invention will be illustrated by the drawings and explained in the description which follows. In this context, it is to be noted that the drawings have only a descriptive character and are not intended to limit the invention in any form. In the drawings.

DETAILED DESCRIPTION

Figure 1:
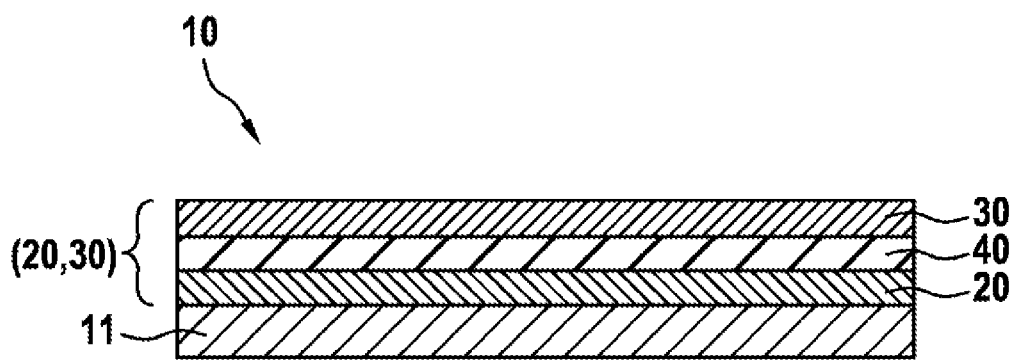
FIG. 1 shows a schematic cross section through a laminated composite according to the invention.

FIG. 1 shows a laminated composite 10 comprising at least one electronic substrate 11 and a layer arrangement 20, 30 made up of at least a first layer 20 of a first metal and/or a first metal alloy and made up of a second layer 30, adjoining said first layer, of a second metal and/or a second metal alloy. The melting temperatures of the first layer 20 and of the second layer 30 are different. A region 40 with at least one intermetallic phase is formed between the first layer and the second layer by a thermal treatment. The first layer or the second layer can be formed by a reaction solder which consists of a mixture of a base solder with an AgX, CuX or NiX alloy. The AgX, CuX or NiX alloy is selected here in such a way that the melting temperature thereof is higher than the melting temperature of the base solder. The mean particle size of the AgX, CuX or NiX alloy can be between 1 nm and 50 µm. The intermetallic phase formed in the region 40 can have a higher melting point than the first layer 20 or second layer 30. This advantageously makes it possible to also use the electronic components in devices which are used at a location with high thermal loading. In the embodiment shown, the region 40 of the intermetallic phase which is formed during a thermal treatment partially replaces the first layer 20 and/or second layer 30 respectively. It is also possible that the region 40 of the intermetallic phase replaces the layers 20 and 30 completely. Advantageously, with the laminated composite 20, 30, it is possible to provide an electrically conductive and/or heat-conducting connection between electronic components and other components or substrates which, at the same time, can ensure a very good compensation of the different coefficients of thermal expansion of the join partners even over a long period of use.

Figure 2:
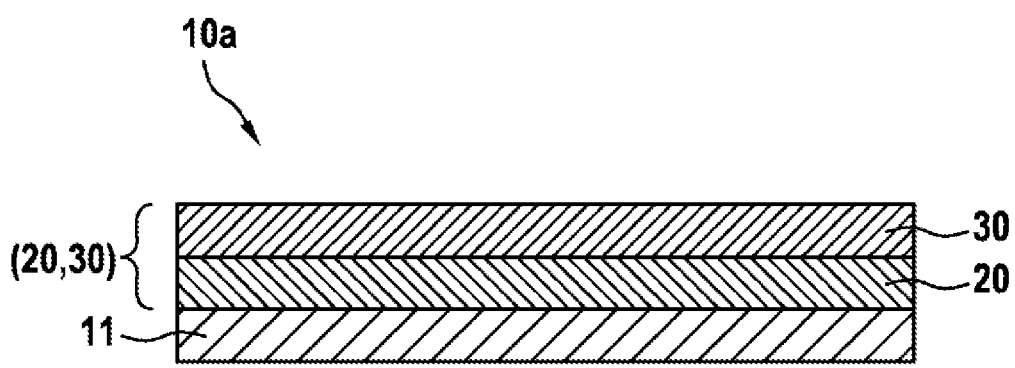
FIG. 2 shows a schematic cross section through a raw laminated composite.

FIG. 2 shows a raw laminated composite 10a comprising at least one electronic substrate 11 and a layer arrangement 20, 30 made up of at least a first layer 20 of a first metal and/or a first metal alloy and made up of a second layer 30, adjoining said first layer, of a second metal and/or a second metal alloy. By subjecting the raw laminated composite 10a to a thermal treatment, an interdiffusion of the metals and/or metal alloys in the first layer and/or second layer can be effected, and therefore a region 40 with at least one intermetallic phase can be formed between the first layer and the second layer and the laminated composite 10 shown in FIG. 1 can be produced. The thermal treatment of the raw laminated composite 10a can be carried out, for example, at a temperature above the melting temperature of the base solder in the reaction solder.

The invention claimed is:

1. A laminated composite (10) comprising at least one electronic substrate (11) and a layer arrangement (20, 30) including at least a first layer of at least one of a first metal and a first metal alloy and including a second layer, adjoining said first layer, of at least one of a second metal and a second metal alloy, wherein melting temperatures of the first layer and of the second layer are different,
  further comprising a region with at least one intermetallic phase (40) between the first layer and the second layer,
  wherein one of the first layer and the second layer is formed by a reaction solder which consists of a mixture of a base solder with an AgX, CuX or NiX alloy, wherein the component X in the AgX, CuX or NiX alloy is selected from the group consisting of B, Mg, Al, Si, Ca, Se, Ti, V, Cr, Mn, Fe, Co, Ni, Cu, Zn, Ga, Ge, Y, Zr, Nb, Mo, Ag, In, Sn, Sb, Ba, Hf, Ta, W, Au, Bi, La, Ce, Pr, Nd, Gd, Dy, Sm, Er, Tb, Eu, Ho, Tm, Yb and Lu, wherein the melting temperature of the AgX, CuX or NiX alloy is higher than the melting temperature of the base solder, wherein the other of the first layer and the second layer, which is not formed by a reaction solder, is an Ag-sintered layer, wherein the AgX, CuX or NiX alloy does not have the same composition as the base solder, wherein the Ag, Cu or Ni content of the layer formed by the reaction solder is between 20% by weight and 80% by weight; and wherein the AgX, CuX or NiX alloy is present in a mean particle size of between 1 nm and 50 μm in the mixture with the base solder.

2. The laminated composite (10) as claimed in claim 1, characterized in that the base solder is selected from the group consisting of SnCu, SnAg, SnAu, SnBi, SnNi, SnZn, SnIn, CuNi, CuAg, AgBi, ZnAl, BiIn, InAg, InGa or a ternary, quaternary or a higher-component alloy made up of a mixture thereof.

3. The laminated composite (10) as claimed in claim 1, characterized in that the first layer (20) or the second layer (30) contains no lead.

4. The laminated composite (10) as claimed in claim 1, characterized in that the reaction solder has a processing temperature of less than 500° C.

5. The laminated composite (10) as claimed in claim 1, characterized in that the intermetallic phase (40) has a higher melting point than the first or second layer.

6. The laminated composite (10) as claimed in claim 1, characterized in that at least one of the first layer (20) and the second layer (30) makes contact with the at least one electronic substrate (11).

7. The laminated composite (10) as claimed in claim 1, characterized in that the at least one electronic substrate (11) is a circuit carrier.

8. A circuit arrangement containing a laminated composite (10) as claimed in claim 1.

9. The laminated composite (10) as claimed in claim 1, characterized in that the at least one electronic substrate (11) is a direct bonded copper (DBC) substrate, an low-temperature co-fired ceramic (LTCC) substrate, a leadframe, a printed circuit board, a power semiconductor or integrated circuit (IC), or a carrier substrate or a heat sink.

10. A laminated composite (10) comprising at least one electronic substrate (11) and a layer arrangement (20, 30) including at least a first layer of at least one of a first metal and a first metal alloy and including a second layer, adjoining said first layer, of at least one of a second metal and a second metal alloy, wherein melting temperatures of the first layer and of the second layer are different, further comprising a region with at least one intermetallic phase (40), wherein one of the first layer and the second layer is formed by a reaction solder which consists of a mixture of a base solder with an AgX, CuX or NiX alloy, wherein the component X in the AgX, CuX or NiX alloy is selected from the group consisting of B, Mg, Al, Si, Ca, Se, Ti, V, Cr, Mn, Fe, Co, Ni, Cu, Zn, Ga, Ge, Y, Zr, Nb, Mo, Ag, In, Sn, Sb, Ba, Hf, Ta, W, Au, Bi, La, Ce, Pr, Nd, Gd, Dy, Sm, Er, Tb, Eu, Ho, Tm, Yb and Lu, wherein the melting temperature of the AgX, CuX or NiX alloy is higher than the melting temperature of the base solder, wherein the other of the first layer and the second layer, which is not formed by a reaction solder, is an Ag-sintered layer, wherein the AgX, CuX or NiX alloy does not have the same composition as the base solder;

wherein the Ag, Cu or Ni content of the layer formed by the reaction solder is between 20% by weight and 80% by weight;

wherein the region of the intermetallic phase (40) encompasses the first layer (20) or second layer (30); and wherein the AgX, CuX or NiX alloy is present in a mean particle size of between 1 nm and 50 μm in the mixture with the base solder.

11. A laminated composite (10) comprising at least one electronic substrate (11) and a layer arrangement (20, 30) including at least a first layer of at least one of a first metal and a first metal alloy and including a second layer, adjoining said first layer, of at least one of a second metal and a second metal alloy, wherein melting temperatures of the first layer and of the second layer are different, further comprising a region with at least one intermetallic phase (40), wherein one of the first layer and the second layer is formed by a reaction solder which consists of a mixture of a base solder with an AgX, CuX or NiX alloy, wherein the component X in the AgX, CuX or NiX alloy is selected from the group consisting of B, Mg, Al, Si, Ca, Se, Ti, V, Cr, Mn, Fe, Co, Ni, Cu, Zn, Ga, Ge, Y, Zr, Nb, Mo, Ag, In, Sn, Sb, Ba, Hf, Ta, W, Au, Bi, La, Ce, Pr, Nd, Gd, Dy, Sm, Er, Tb, Eu, Ho, Tm, Yb and Lu, wherein the melting temperature of the AgX, CuX or NiX alloy is higher than the melting temperature of the base solder, wherein the other of the first layer and the second layer, which is not formed by a reaction solder, is an Ag-sintered layer, wherein the AgX, CuX or NiX alloy does not have the same composition as the base solder;

wherein the Ag, Cu or Ni content of the layer formed by the reaction solder is between 20% by weight and 80% by weight;

wherein the region of the intermetallic phase (40) partially replaces at least one of the first layer (20) and the second layer (30); and wherein the AgX, CuX or NiX alloy is present in a mean particle size of between 1 nm and 50 μm in the mixture with the base solder.

12. A method for forming a laminated composite (10) as claimed in claim 1, comprising the following steps:

forming a raw laminated composite (10a) containing a layer arrangement (20, 30) and at least one electronic substrate (11), wherein the layer arrangement (20, 30) contains at least a first layer (20) of at least one of a first metal and a first metal alloy and a second layer (30), adjoining said first layer, of at least one of a second metal and a second metal alloy, wherein the melting temperatures of the first layer (20) and of the second layer (30) are different, wherein the first layer (20) or the second layer (30) is formed by a reaction solder which consists of a mixture of a base solder with an AgX, CuX or NiX alloy, and wherein the melting temperature of the AgX, CuX or NiX alloy is higher than the melting temperature of the base solder, subjecting the layer arrangement (20, 30) or the raw laminated composite (10a) to thermal treatment, as a result of which interdiffusion of at least one of the metals and the metal alloys in at least one of the first layer (20) and the second layer (30) takes place, and forming the laminated composite (10) containing at least one region of an intermetallic phase (40) between the first layer and the second layer.

13. The method as claimed in claim 12, characterized in that the thermal treatment is carried out at a temperature above the melting temperature of the base solder in the reaction solder.

14. A laminated composite (10) comprising at least one electronic substrate (11) and a layer arrangement (20, 30) including at least a first layer of at least one of a first metal and a first metal alloy and a region with at least one intermetallic phase (40), wherein the region with at least one intermetallic phase is formed from said first layer and a second layer, of at least one of a second metal and a second metal alloy, wherein melting temperatures of the first layer and of the second layer are different, wherein one of the first layer and the second layer is formed by a reaction solder which consists of a mixture of a base solder with an AgX, CuX or NiX alloy, wherein the component X in the AgX, CuX or NiX alloy is selected from the group consisting of B, Mg, Al, Si, Ca, Se, Ti, V, Cr, Mn, Fe, Co, Ni, Cu, Zn, Ga, Ge, Y, Zr, Nb, Mo, Ag, In, Sn, Sb, Ba, Hf, Ta, W, Au, Bi, La, Ce, Pr, Nd, Gd, Dy, Sm, Er, Tb, Eu, Ho, Tm, Yb and Lu, wherein the melting temperature of the AgX, CuX or NiX alloy is higher than the melting temperature of the base solder, wherein the other of the first layer and the second layer, which is not formed by a reaction solder, is an Ag-sintered layer, wherein the AgX, CuX or NiX alloy does not have the same composition as the base solder;

wherein the Ag, Cu or Ni content of the layer formed by the reaction solder is between 20% by weight and 80% by weight; and wherein the AgX, CuX or NiX alloy is present in a mean particle size of between 1 nm and 50 μm in the mixture with the base solder.

* * * * *